(12) United States Patent
Kim et al.

(10) Patent No.: US 10,503,072 B2
(45) Date of Patent: Dec. 10, 2019

(54) METHODS OF FABRICATING SEMICONDUCTOR DEVICES WITH FLATTENED HARDMASK LAYERS

(71) Applicant: Samsung Electronics Co., Ltd., Suwon-si, Gyeonggi-do (KR)

(72) Inventors: DoYoung Kim, Hwaseong-si (KR); Kyoungsil Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 15/783,593

(22) Filed: Oct. 13, 2017

(65) Prior Publication Data

US 2018/0039181 A1 Feb. 8, 2018

Related U.S. Application Data

(62) Division of application No. 14/737,962, filed on Jun. 12, 2015, now Pat. No. 9,829,795.

(30) Foreign Application Priority Data

Sep. 5, 2014 (KR) ........................ 10-2014-0118593

(51) Int. Cl.
*G03F 7/32* (2006.01)
*H01L 21/027* (2006.01)
*H01L 21/311* (2006.01)
*H01L 21/033* (2006.01)
*H01L 21/3105* (2006.01)

(52) U.S. Cl.
CPC ............ *G03F 7/32* (2013.01); *H01L 21/0271* (2013.01); *H01L 21/0274* (2013.01); *H01L 21/0337* (2013.01); *H01L 21/311* (2013.01); *H01L 21/31058* (2013.01); *H01L 21/31144* (2013.01)

(58) Field of Classification Search
CPC ............ H01L 21/0271; H01L 21/0332; H01L 21/0337; H01L 21/0338; H01L 21/312
USPC .......... 430/270.1, 272.1, 311, 312, 313, 323, 430/325, 327, 330, 910
See application file for complete search history.

(56) References Cited

U.S. PATENT DOCUMENTS

| 5,403,435 | A | * | 4/1995 | Cathey | ............... H01L 21/0274 216/17 |
| 7,270,931 | B2 | | 9/2007 | Angelopoulos et al. | |
| 7,939,244 | B2 | | 5/2011 | Xu et al. | |
| 8,211,806 | B2 | * | 7/2012 | Wu | ..................... H01L 21/0337 438/717 |
| 8,415,083 | B2 | * | 4/2013 | Sun | ...................... G03F 7/0752 430/270.1 |

(Continued)

FOREIGN PATENT DOCUMENTS

| KR | 10-1997-0008410 | 2/1997 |
| KR | 100168150 B1 | 10/1998 |

(Continued)

*Primary Examiner* — Edward Chin
(74) *Attorney, Agent, or Firm* — Myers Bigel, P.A.

(57) ABSTRACT

Methods of fabricating semiconductor devices may include forming a hardmask layer including a photosensitive hardmask material on lower structures. The hardmask layer may include a lower portion and an upper portion thereon. An exposing and developing process may be performed on the hardmask layer to remove the upper portion of the hardmask layer and thereby form a hardmask structure with a substantially flat top surface.

20 Claims, 17 Drawing Sheets

(56) References Cited

U.S. PATENT DOCUMENTS

| | | | |
|---|---|---|---|
| 8,835,093 B2* | 9/2014 | Shibayama | C08L 83/04 |
| | | | 430/270.1 |
| 9,385,028 B2* | 7/2016 | Nemani | H01L 21/7682 |
| 9,633,999 B1* | 4/2017 | Lu | H01L 27/088 |
| 2007/0117310 A1* | 5/2007 | Bai | H01L 21/0337 |
| | | | 438/242 |
| 2007/0212654 A1* | 9/2007 | Larson | G03F 7/2022 |
| | | | 430/322 |
| 2010/0184295 A1* | 7/2010 | Sato | H01L 21/3083 |
| | | | 438/702 |
| 2010/0255412 A1 | 10/2010 | Sun | |
| 2011/0129781 A1* | 6/2011 | Kim | G03F 7/0045 |
| | | | 430/323 |
| 2015/0214066 A1* | 7/2015 | Luere | H01L 21/02063 |
| | | | 438/696 |
| 2015/0279738 A1* | 10/2015 | Wells | H01L 21/76897 |
| | | | 257/382 |

FOREIGN PATENT DOCUMENTS

| | | |
|---|---|---|
| KR | 1019990009543 A | 2/1999 |
| KR | 100734663 B1 | 6/2007 |
| KR | 1020090081230 A | 7/2009 |

* cited by examiner

METHODS OF FABRICATING SEMICONDUCTOR DEVICES WITH FLATTENED HARDMASK LAYERS

CROSS-REFERENCE TO RELATED APPLICATIONS

This application is a divisional of U.S. patent application Ser. No. 14/737,962 filed Jun. 12, 2015 which claims priority under 35 U.S.C. § 119 to Korean Patent Application No. 10-2014-0118593, filed on Sep. 5, 2014, in the Korean Intellectual Property Office, the disclosures of which are incorporated by reference herein in their entireties.

BACKGROUND

Example embodiments of the present inventive concepts relate to methods of fabricating semiconductor devices, and in particular, to hardmask structures, and methods of forming patterns using the same.

A variety of technologies have been developed to increase the integration density of a semiconductor device by forming extremely fine patterns on the semiconductor substrate. For example, multi-layer lithography technology, double or quadruple patterning technology, and V-NAND technology have been used to increase the integration density of semiconductor devices. To realize such technologies, a plurality of layers may be stacked on a substrate. However, depending on the structure and shape of an underlying pattern, the stack of layers may have a portion whose thickness or height is different from other portions. This height difference may lead to technical issues, such as deterioration in uniformity in critical dimensions (CD), and/or to difficulties in forming patterns in subsequent processes.

SUMMARY

Example embodiments of the present inventive concepts provide methods of forming flattened hardmask structures.

Other example embodiments of the present inventive concepts provide methods of forming patterns using flattened hardmask structures.

According to example embodiments of the present inventive concepts, a method of fabricating a semiconductor device may include forming a hardmask layer including a photosensitive hardmask material on a lower structure, the hardmask layer having a top surface with a first top surface on a lower portion of the hardmask layer and a second top surface, higher than the first top surface, on an upper portion of the hardmask layer, and performing an exposing and developing process on the hardmask layer to remove the upper portion of the hardmask layer while leaving the lower portion of the hardmask layer intact and thereby form a hardmask structure with a flat top surface.

According to example embodiments of the present inventive concepts, a method of fabricating a semiconductor device may include forming first hardmask patterns on a lower layer, forming a spacer layer to conformally cover the lower layer and the first hardmask patterns, forming a second hardmask layer comprising a photosensitive material on the spacer layer, the second hardmask layer having a lower portion and an upper portion thereon, performing an exposing and developing process on the second hardmask layer which removes the upper portion of the second hardmask layer and thereby forms second hardmask patterns on the spacer layer and between the first hardmask patterns, removing portions of the spacer layer between the first and second hardmask patterns to expose portions of the lower layer, and etching the lower layer using the first and second hardmask patterns as an etch mask.

According to example embodiments of the present inventive concepts, a method of fabricating a semiconductor device may include forming a structure on a substrate, forming a hardmask layer comprising a photosensitive hardmask material on the structure, performing an exposing process on the hardmask layer, and performing a developing process on the hardmask layer. The hardmask layer may have a top surface including a first top surface on a lower portion of the hardmask layer and a second top surface, higher than the first top surface, on an upper portion of the hardmask layer. The upper portion of the hardmask layer may be between the first and second top surfaces of the hardmask layer in a vertical direction, and the lower portion of the hardmask layer may be below the first top surface of the hardmask layer in a vertical direction. In performing the exposing process on the hardmask layer, a depth of focus of a light source may be configured to selectively expose a portion of the hardmask layer. Performing the exposing process on the hardmask layer, may remove the upper portion of the hardmask layer and forms a hardmask structure with a substantially flat top surface.

BRIEF DESCRIPTION OF THE DRAWINGS

Example embodiments will be more clearly understood from the following brief description taken in conjunction with the accompanying drawings. The accompanying drawings represent non-limiting, example embodiments of the present inventive concepts as described herein.

Figure 1:
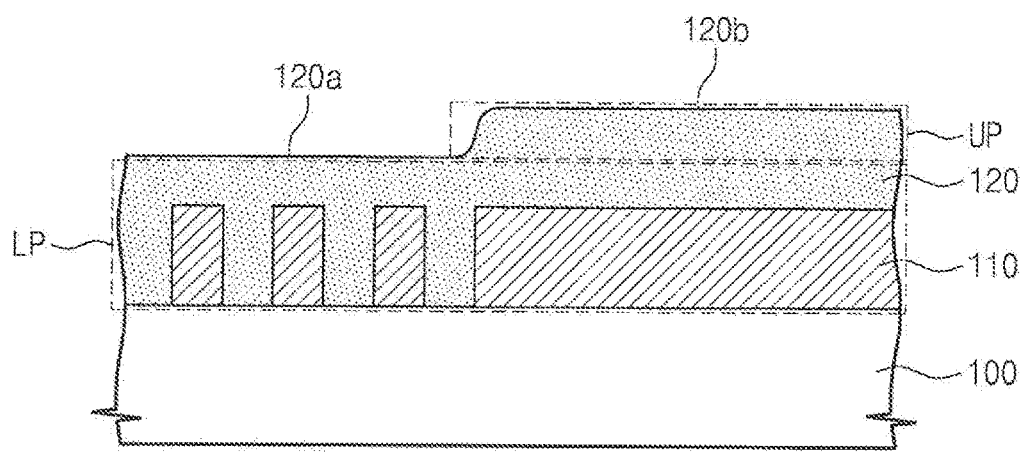
FIGS. 1 through 4 are sectional views illustrating methods of fabricating semiconductor devices according to example embodiments of the present inventive concepts.

It should be noted that these figures are intended to illustrate the general characteristics of methods, structure and/or materials utilized in certain example embodiments of the present inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present inventive concepts will now be described more fully with reference to the accompanying drawings, in which example embodiments are shown. Example embodiments of the present inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

Further, embodiments are described herein with reference to cross-sectional views and/or plan views that are idealized schematic views of the present inventive concepts. The thicknesses of layers and parts in the figures are overstated for the effective description of technical content. Thus, shapes of the schematic views may vary according to manufacturing techniques and/or tolerances. Therefore, the embodiments of the present inventive concepts are not limited to the particular shapes illustrated herein but are to include deviations in shapes formed in accordance with the manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the present inventive concepts belong. It will be further understood that terms, such as those defined in commonly-used dictionaries, should be interpreted as having a meaning that is consistent with their meaning in the context of this specification and the relevant art and will not be interpreted in an idealized or overly formal sense unless expressly so defined herein.

FIGS. 1 through 4 are sectional views illustrating methods of fabricating semiconductor devices according to example embodiments of the present inventive concepts.

Referring to FIG. 1, a hardmask layer 120 may be formed on a lower structure 110. The lower structure 110 may be provided on a substrate 100. Depending on the geometry of the lower structure 110, a staircase structure may be formed in the hardmask layer 120. For example, the hardmask layer 120 may have a first top surface 120a and a second top surface 120b, which may be positioned at a higher level than the first top surface 120a. Further, the hardmask layer 120 may include a lower portion LP and an upper portion UP on the lower portion LP. When viewed in a vertical cross-section, the upper portion UP may be a portion of the hardmask layer 120 positioned between the levels of the first and second top surfaces 120a and 120b, whereas the lower portion LP may be another portion of the hardmask layer 120 positioned below the level of the first top surface 120a or the upper portion UP.

The hardmask layer 120 may be formed by coating the lower structure 110 with a photosensitive hardmask material using, for example, a spin coating process. The photosensitive hardmask material may be of a positive resist type. For example, an exposed portion of the hardmask layer 120 may be dissolved by a developing solution, and an unexposed portion thereof may not be dissolved by the developing solution. The photosensitive hardmask material may contain a resin, a photoresist material, a cross-linking agent, and/or a solvent. The resin may include, for example, at least one of aromatic hydrocarbon, such as naphthalene, anthracene, and pyrene, with two or more benzene rings, aromatic hydrocarbon with a hydroxyl group and two or more benzene rings, novolak, and/or poly hydroxyl styrene, but is not limited thereto. The photoresist material may include, for example, at least one of an organic acid, a photoacid generator (PGA), such as sulfonate and diazosulfonate, and/or a photoactive compound such as diazo naphta quinone, but is not limited thereto. The cross-linking agent may be aminoplast, but is not limited thereto.

Figure 2:
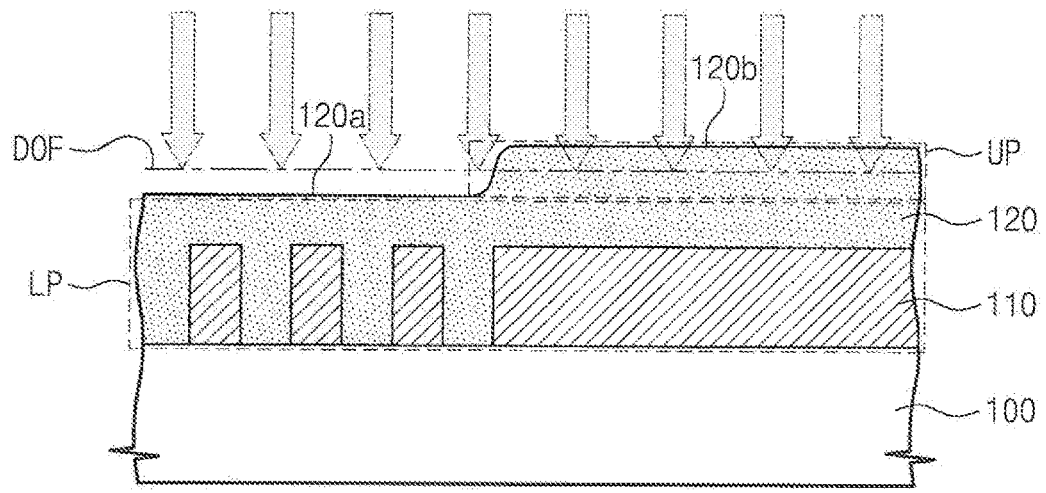
Figure 3:
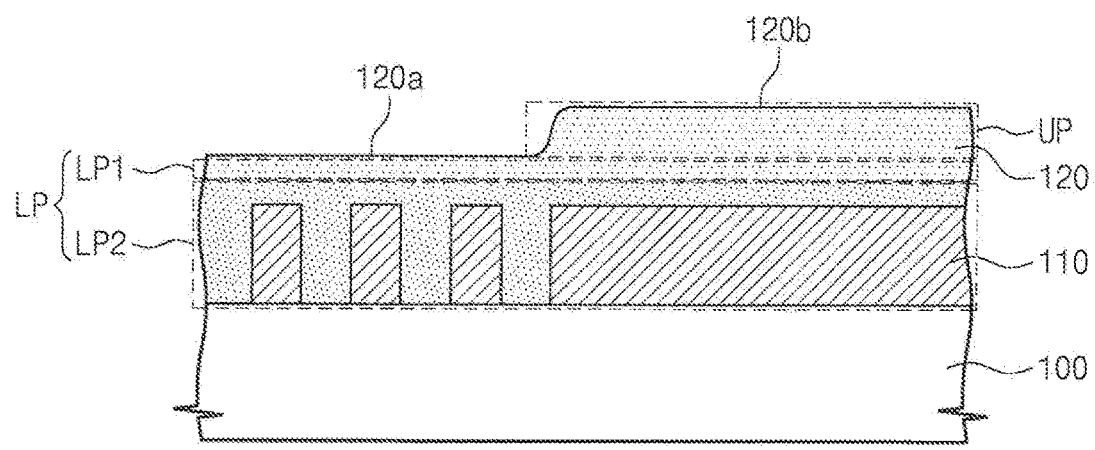

Referring to FIGS. 2 and 3, an exposing process may be performed on the resulting structure with the hardmask layer 120. In the exposing process, a depth of focus DOF may be controlled to be between the levels of the first and second top surfaces 120a and 120b. Accordingly, the upper portion UP of the hardmask layer 120 may be substantially irradiated by light in the exposing process, causing the upper portion UP to have an increased solubility to a developing solution.

However, referring to FIG. 3, in some embodiments a portion LP1 of the lower portion LP adjacent to the upper portion UP may also be exposed when the upper portion UP of the hardmask layer 120 is exposed. In this case, the portion LP1 of the lower portion LP may have an increased solubility to the developing solution.

Figure 4:
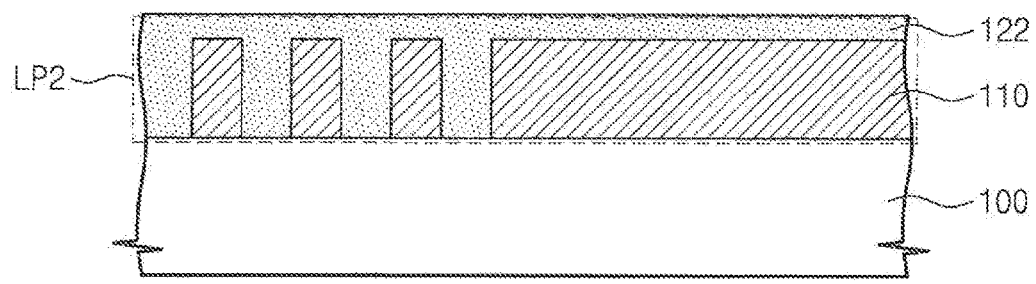

Referring to FIG. 4, a developing process may be performed to remove the upper exposed portion UP of the hardmask layer 120. As a result of the removal of the upper portion UP, a hardmask structure 122 having a substantially flat top surface may be formed on the lower structure 110.

If the portion LP1 of the lower portion LP is exposed, it may also be removed by the developing process. In this case, the hardmask structure 122 may also be formed to have a substantially flat top surface.

Thereafter, a photoresist pattern may be formed on the hardmask structure 122, and the hardmask structure 122 may be etched using the photoresist pattern as an etch mask. Since the hardmask structure 122 has a substantially flat top surface, it may be possible to improve uniformity in critical dimensions (CD) of the photoresist patterns and/or the etched hardmask structures, and moreover, reduce or suppress pattern failures from occurring.

In addition, since the hardmask layer can be planarized by the exposing and developing process described above, the hardmask structure 122 can be formed without using an etch-back or chemical mechanical polishing (CMP) process. Accordingly, it may be possible to simplify the overall fabrication process and/or improve productivity of the fabrication process.

Figure 5:
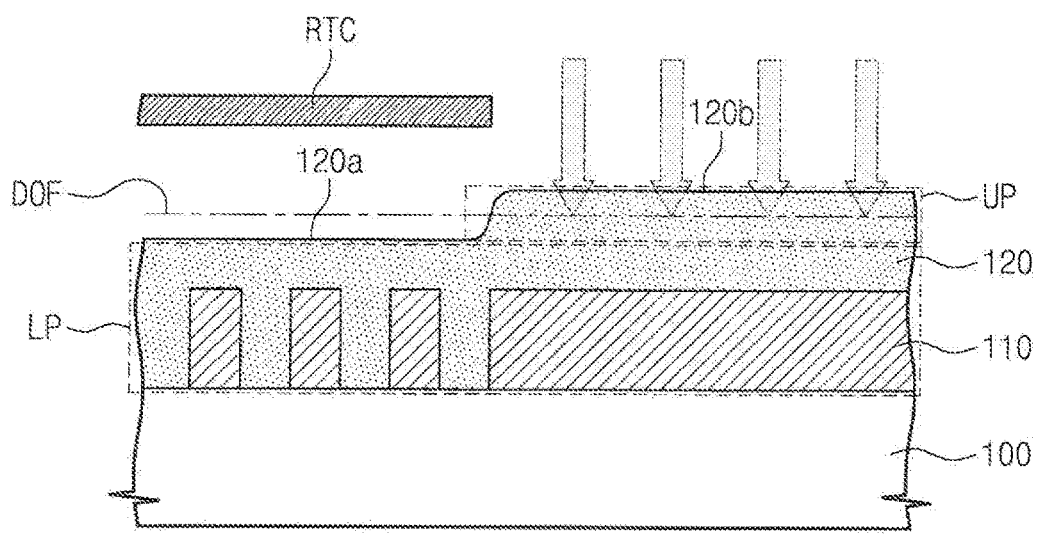
FIGS. 5 through 7 are sectional views illustrating methods of fabricating semiconductor devices according to other example embodiments of the present inventive concepts.
Figure 6:
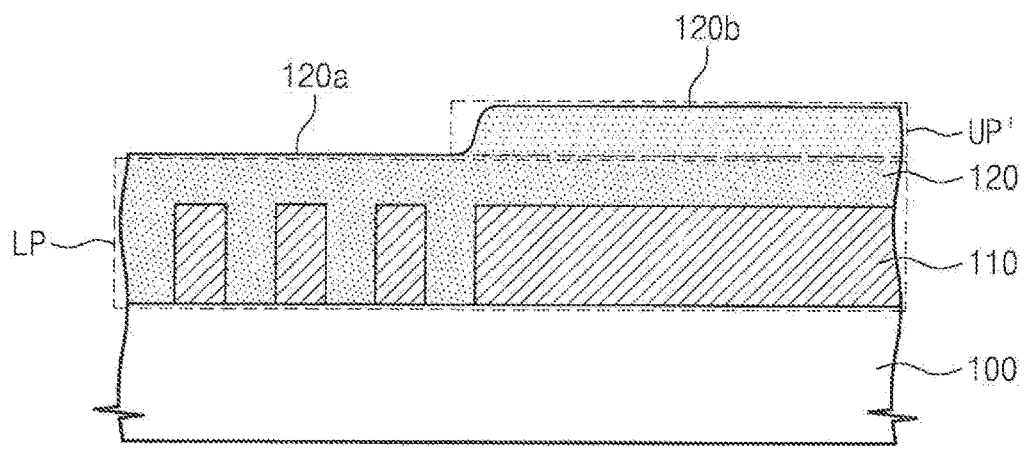
Figure 7:
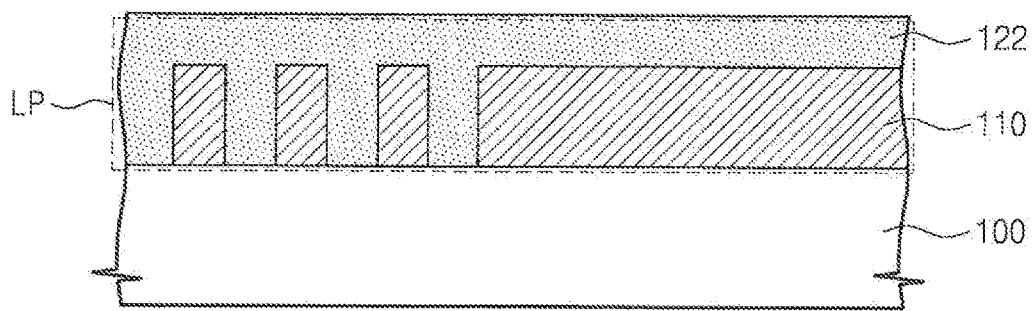

FIGS. 5 through 7 are sectional views illustrating methods of fabricating semiconductor devices according to other example embodiments of the present inventive concepts.

The hardmask layer 120 may be formed on the lower structure 110. The hardmask layer 120 may be formed to have substantially the same features as that of FIG. 1, and thus, for convenience in description, a detailed description thereof will be omitted below.

Referring to FIGS. 5 and 6, a reticle RTC, which may be configured to expose the second top surface 120b, may be used to perform an exposing process on the upper portion UP of the hardmask layer 120. In the exposing process, a depth of focus DOF may be controlled to be between the levels of the first and second top surfaces 120a and 120b, and thus, the lower portion LP of the hardmask layer 120 may not be exposed. The exposed upper portion UP' of the hardmask layer 120 may have an increased solubility to a developing solution, compared to the lower portion LP of the hardmask layer 120.

Referring to FIG. 7, a developing process may be performed to remove the exposed upper portion UP' of the hardmask layer 120. As a result of the removal of the exposed upper portion UP', a hardmask structure 122 having a substantially flat top surface may be formed on the lower structure 110.

Thereafter, a photoresist pattern may be formed on the hardmask structure 122, and the hardmask structure 122 may be etched using the photoresist pattern as an etch mask. Since the hardmask structure 122 has the substantially flat top surface, it may be possible to improve uniformity in critical dimensions (CD) of the photoresist patterns and/or the etched hardmask structures, and, moreover, to reduce or suppress pattern failures from occurring.

In addition, since the planarization of the hardmask layer is achieved by the exposing and developing process, the hardmask structure 122 can be formed without using an etch-back or chemical mechanical polishing (CMP) process. Accordingly, it may be possible to simplify the overall fabrication process and/or improve productivity of the fabrication process.

FIGS. 8 through 11 are sectional views illustrating methods of fabricating semiconductor devices according to still other example embodiments of the present inventive concepts.

Figure 8:
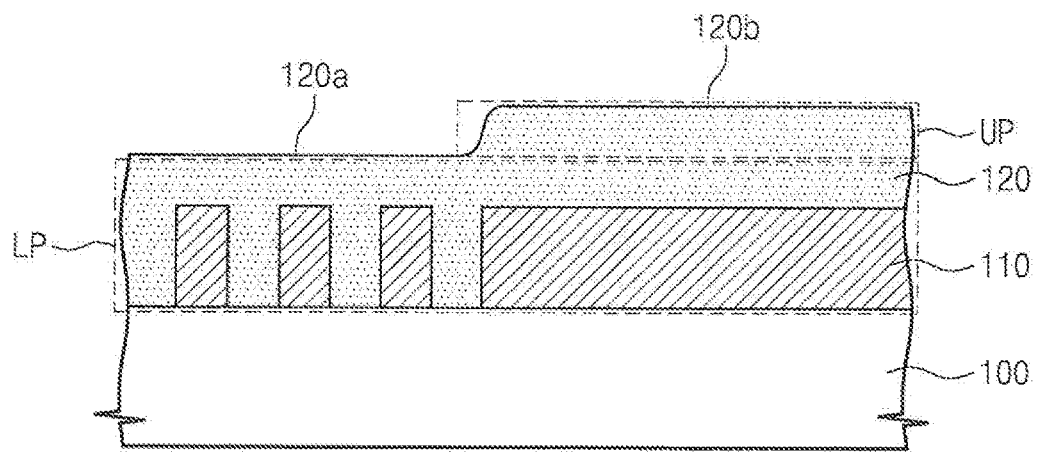
FIGS. 8 through 11 are sectional views illustrating methods of fabricating semiconductor devices according to still other example embodiments of the present inventive concepts.

Referring to FIG. 8, the hardmask layer 120 may be formed on the lower structure 110. The lower structure 110 may be provided on a substrate 100. Depending on the geometry of the lower structure 110, a staircase structure may be formed in the hardmask layer 120. For example, the hardmask layer 120 may have a first top surface 120a and a second top surface 120b, which is positioned at a higher level than the first top surface 120a. Further, the hardmask layer 120 may include a lower portion LP and an upper portion UP on the lower portion LP. When viewed in a vertical cross-section, the upper portion UP may be a portion of the hardmask layer 120 positioned between the levels of the first and second top surfaces 120a and 120b, whereas the lower portion LP may be another portion of the hardmask layer 120 positioned below the level of the first top surface 120a or the upper portion UP.

The hardmask layer 120 may be formed by coating the lower structure 110 with a photosensitive hardmask material using, for example, a spin coating process. The photosensitive hardmask material may be of a negative resist type. For example, an exposed portion of the hardmask layer 120 may not be dissolved by a developing solution, and an unexposed portion thereof may be dissolved by the developing solution. The photosensitive hardmask material may contain a resin, a photoresist material, a cross-linking agent, and/or a solvent. The resin may include, for example, at least one of aromatic hydrocarbon, such as naphthalene, anthracene, and pyrene, with two or more benzene rings, aromatic hydrocarbon with a hydroxyl group and two or more benzene rings, novolak, and/or poly hydroxyl styrene, but is not limited thereto. The photoresist material may include, for example, at least one of a photoacid generator (PGA), such as triphenylsulfonium, and/or a photoactive compound, but is not limited thereto. The cross-linking agent may be an amine-based and/or phenol-based material, but is not limited thereto.

Figure 9:
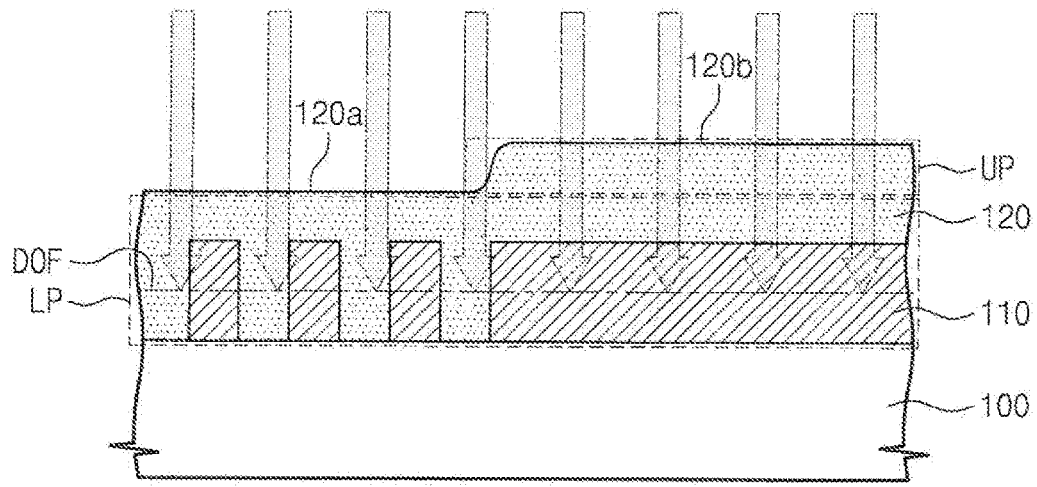
Figure 10:
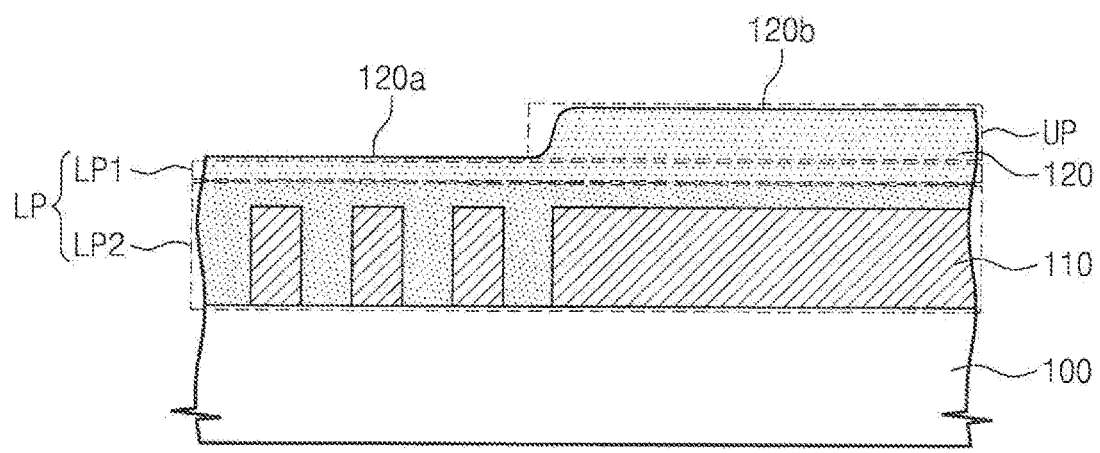

Referring to FIG. 9 and FIG. 10, an exposing process may be performed on the resulting structure with the hardmask layer 120. In the exposing process, a depth of focus DOF may be controlled to be between the levels of the first top surface 120a and a bottom surface of the hardmask layer 120. Since the hardmask layer 120 is of a negative type, the exposed portion LP2 of the lower portion LP may have a decreased solubility to a developing solution.

Meanwhile, during the exposing process, a sufficient energy may not be supplied to a portion LP1 of the lower portion LP adjacent to the upper portion UP, and thus, the portion LP1 may have a higher solubility to the developing solution, compared to that of the exposed portion LP2 of the hardmask layer 120. In some embodiments of the present inventive concepts, both the portion LP1 and the upper portion UP may have a higher solubility to the developing solution, compared to that of the exposed portion LP2 of the hardmask layer 120.

Figure 11:
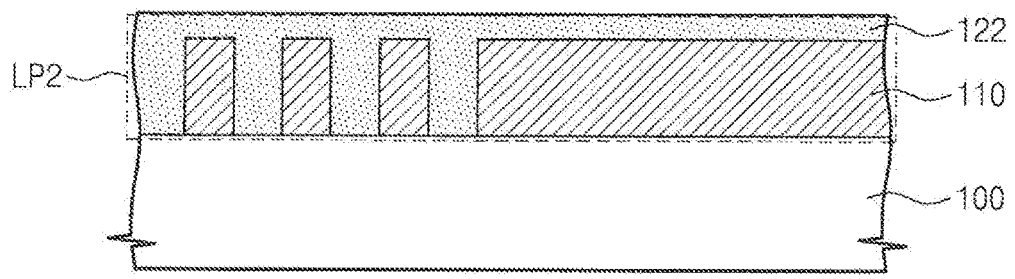

Referring to FIG. 11, a developing process may be performed to remove the upper portion UP of the hardmask layer 120. As a result of the removal of the upper portion UP, the hardmask structure 122 having a substantially flat top surface may be formed on the lower structure 110.

In the case where a sufficient energy is not supplied to the portion LP1 of the hardmask layer 120, it may be also removed by the developing process. In this case, the hardmask structure 122 may be formed to have a substantially flat top surface.

Thereafter, a photoresist pattern may be formed on the hardmask structure 122, and the hardmask structure 122 may be etched using the photoresist pattern as an etch mask. Since the hardmask structure 122 has a substantially flat top surface, it may be possible to improve uniformity in critical dimensions (CD) of the photoresist patterns and/or the etched hardmask structures, and, moreover, to reduce or suppress pattern failures from occurring.

In addition, since the hardmask layer can be planarized by the exposing and developing process described above, the hardmask structure 122 can be formed without using an etch-back or chemical mechanical polishing (CMP) process. Accordingly, it may be possible to simplify the overall fabrication process and/or improve productivity of the fabrication process.

Figure 12:
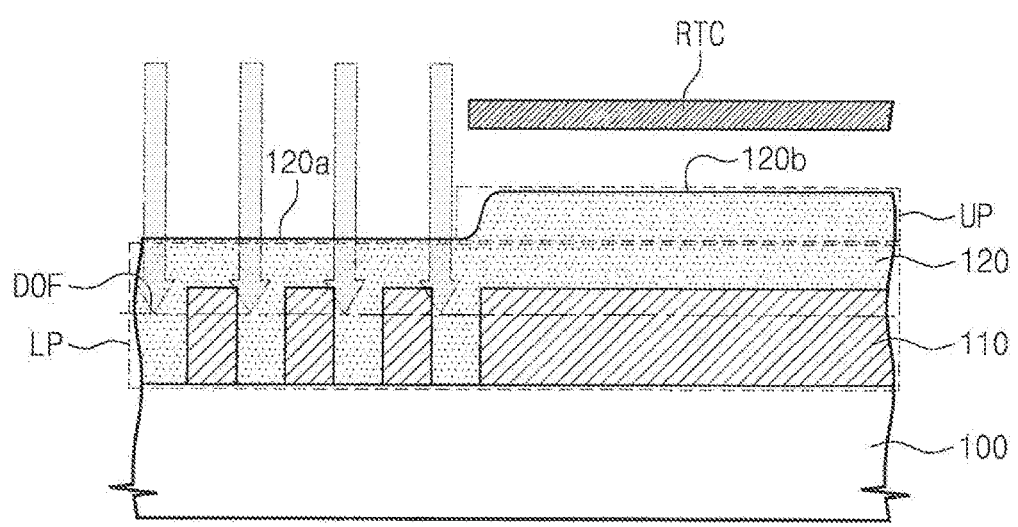
FIGS. 12 through 14 are sectional views illustrating methods of fabricating semiconductor devices according to even other example embodiments of the present inventive concepts.
Figure 13:
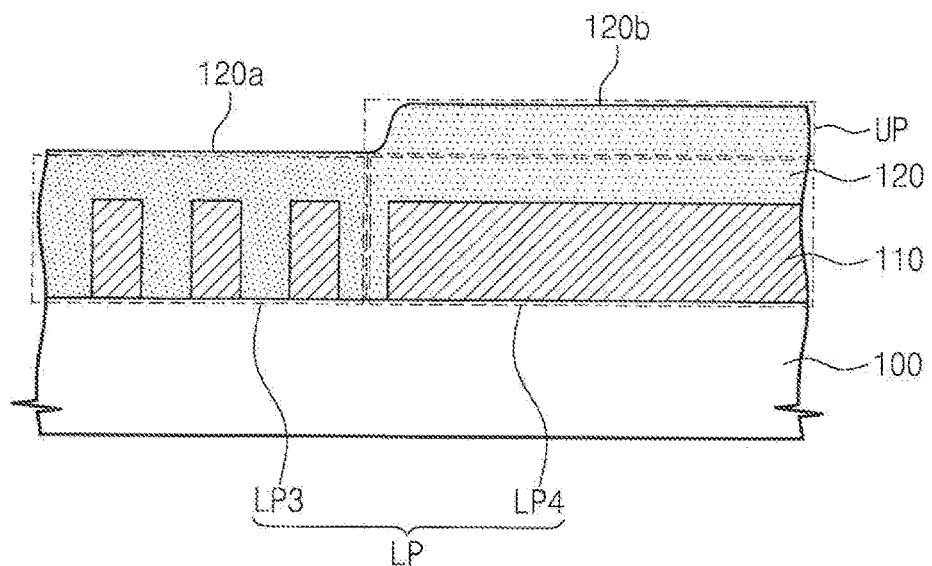
Figure 14:
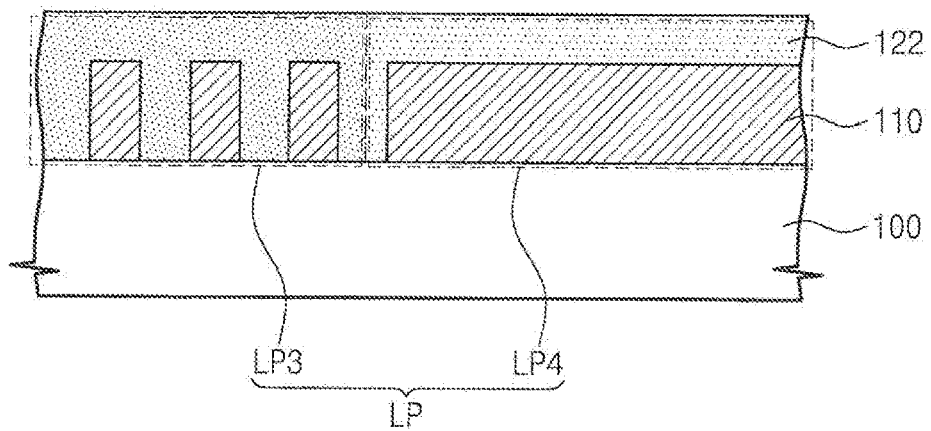

FIGS. 12 through 14 are sectional views illustrating methods of fabricating semiconductor devices according to even other example embodiments of the present inventive concepts.

A hardmask layer 120 may be formed on a lower structure 110. The hardmask layer 120 may be formed to have substantially similar features as that of FIG. 8, and thus, for convenience in description, a detailed description thereof will be omitted below.

Referring to FIGS. 12 and 13, a reticle RTC, which may be configured to expose the first top surface 120a, may be used to perform an exposing process on the portion LP3 of the hardmask layer 120 positioned below the first top surface 120a. For example, the reticle RTC may be configured to expose the first top surface 120a and cover the second top surface 120b, and thus, in the exposing process, light may be incident into the hardmask layer 120 through the first top surface 120a. In the exposing process, a depth of focus DOF may be controlled to be between the levels of the first top surface 120a and a bottom surface of the hardmask layer 120. In the case where the hardmask layer 120 is of a negative resist type, an exposed portion LP3 of the lower portion LP below the first top surface 120a may have a decreased solubility to a developing solution.

Referring to FIG. 14, a developing process may be performed to remove the upper portion UP of the hardmask layer 120 and form a hardmask structure 122. By adjusting a process time of the developing process, it may be possible to prevent a portion LP4 of the lower portion LP positioned below the second top surface 120b from being developed. In other words, the developing process may be performed to prevent the portion LP4, which is overlapped by the second top surface 120b in a plan view, from being removed. As a result of the removal of the upper portion UP of the hardmask layer 120, the hardmask structure 122 may have a substantially flat top surface.

Thereafter, a photoresist pattern may be formed on the hardmask structure 122, and the hardmask structure 122 may be etched using the photoresist pattern as an etch mask. Since the hardmask structure 122 has the substantially flat top surface, it may be possible to improve uniformity in critical dimensions (CD) of the photoresist patterns and/or the etched hardmask structures and moreover reduce or suppress pattern failures from occurring.

In addition, since the planarization of the hardmask layer can be achieved by the exposing and developing process, the hardmask structure 122 can be formed without using an etch-back or chemical mechanical polishing (CMP) process. Accordingly, it may be possible to simplify the overall fabrication process and improve productivity of the fabrication process.

FIGS. 15 through 18 are sectional views illustrating methods of fabricating semiconductor devices according to yet other example embodiments of the present inventive concepts.

Figure 15:
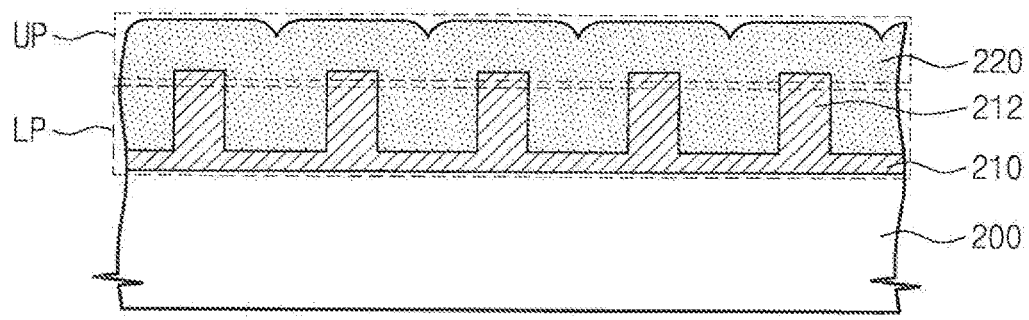
FIGS. 15 through 18 are sectional views illustrating methods of fabricating semiconductor devices according to yet other example embodiments of the present inventive concepts.

Referring to FIG. 15, a hardmask layer 220 may be formed on a lower structure 210. The lower structure 210 may be provided on a substrate 200. The lower structure 210 may include lower patterns 212, and thus, the hardmask layer 220 may have a non-flat top surface. The hardmask layer 220 may include a lower portion LP and an upper portion UP on the lower portion LP. The lower portion LP may be a portion of the hardmask layer 220 positioned below the level of top surfaces of the lower patterns 212.

The hardmask layer 220 may be formed by coating the lower structure 210 with a photosensitive hardmask material using, for example, a spin coating process. The photosensitive hardmask material may be of a positive resist type. For example, an exposed portion of the hardmask layer 220 may be dissolved by a developing solution, and an unexposed portion thereof may not be dissolved by the developing solution. The photosensitive hardmask material may contain a resin, a photoresist material, a cross-linking agent, and/or a solvent. The resin may include, for example, at least one of aromatic hydrocarbon, such as naphthalene, anthracene, and pyrene, with two or more benzene rings, aromatic hydrocarbon with a hydroxyl group and two or more benzene rings, novolak, and/or poly hydroxyl styrene, but is not limited thereto. The photoresist material may include, for example, at least one of an organic acid, a photoacid generator (PGA), such as sulfonate and diazosulfonate, and/or a photoactive compound such as diazo naphta quinone, but is not limited thereto. The cross-linking agent may be aminoplast, but is not limited thereto.

Figure 16:
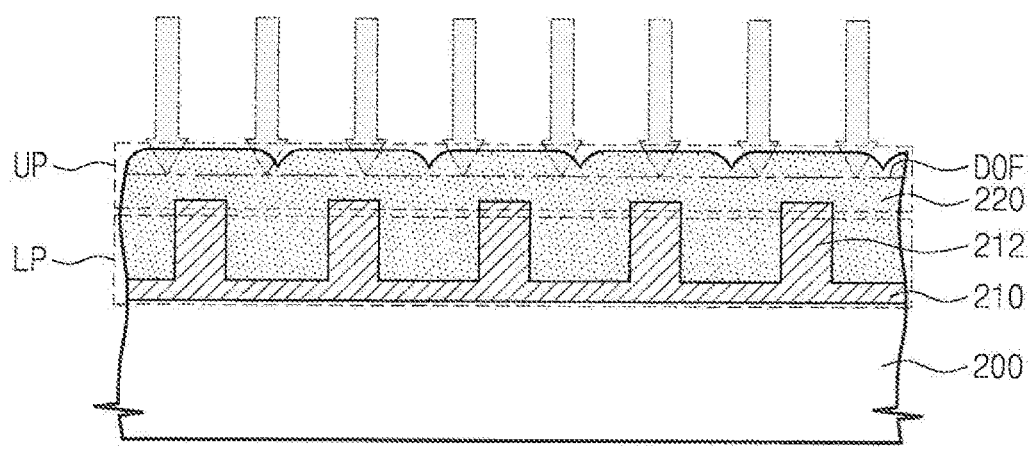
Figure 17:
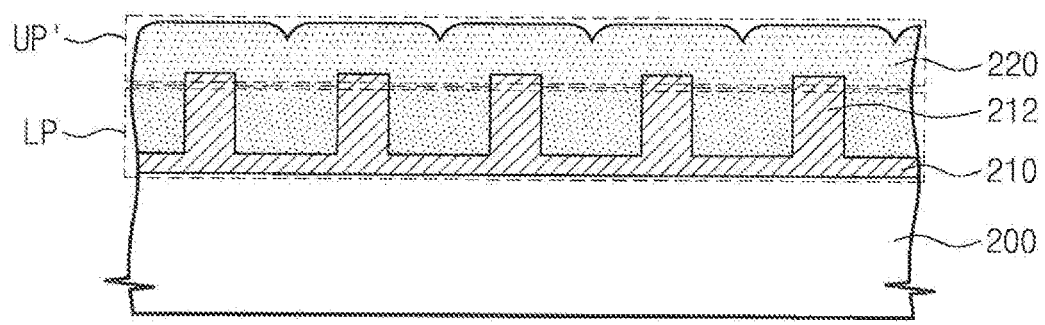

Referring to FIGS. 16 and 17, an exposing process may be performed on the resulting structure with the hardmask layer 220. In the exposing process, a depth of focus DOF may be controlled to be between the levels of top surfaces of the lower patterns 212 and the hardmask layer 220. Accordingly, the exposing process may be performed on the upper portion UP of the hardmask layer 220. The exposed upper portion UP' of the hardmask layer 220 may have an increased solubility to a developing solution.

Figure 18:
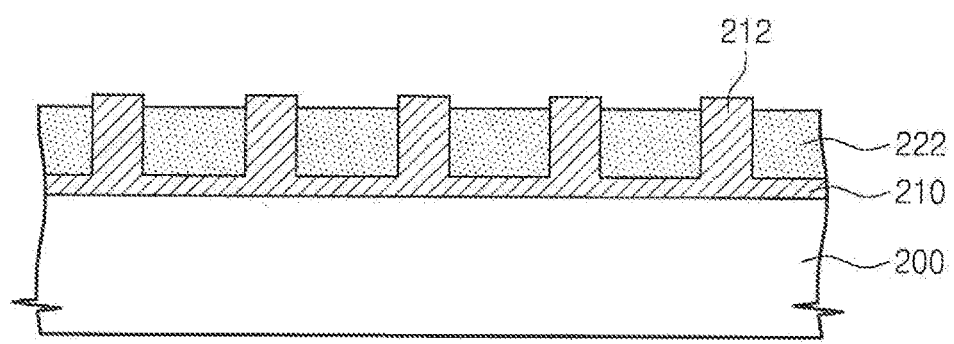

Referring to FIG. 18, a developing process may be performed to remove the exposed upper portion UP' of the hardmask layer 220. As a result of the removal of the exposed upper portion UP', a hardmask structure 222 may be formed to have a substantially flat top surface and the top surfaces of the lower patterns 212 may be exposed. In other words, since the exposed upper portion UP' having the non-flat top surface is removed, the hardmask structure 222 may have a substantially flat top surface.

Since the lower patterns 212 may be exposed by the exposing and developing process, the hardmask structure 222 can be formed without using an etch-back or chemical mechanical polishing (CMP) process. Accordingly, it may be possible to simplify the overall fabrication process and improve productivity of the fabrication process.

FIGS. 19 through 22 are sectional views illustrating a method of fabricating semiconductor devices according to further example embodiments of the present inventive concepts.

Figure 19:
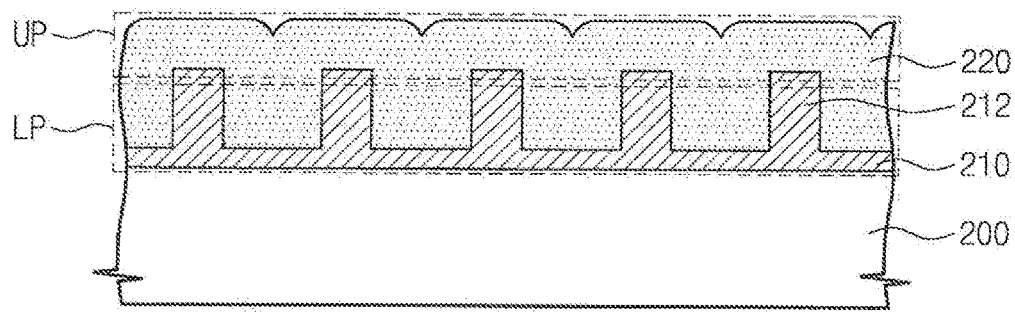
FIGS. 19 through 22 are sectional views illustrating methods of fabricating semiconductor devices according to further example embodiments of the present inventive concepts.

Referring to FIG. 19, the hardmask layer 220 may be formed on the lower structure 210. The lower structure 210 may be provided on the substrate 200. The lower structure 210 may include lower patterns 212, and thus, the hardmask layer 220 may have a non-flat top surface. The hardmask layer 220 may include a lower portion LP and an upper portion UP on the lower portion LP. The lower portion LP may be a portion of the hardmask layer 220 positioned below the level of top surfaces of the lower patterns 212.

The hardmask layer 220 may be formed by coating the lower structure 210 with a photosensitive hardmask material using, for example, a spin coating process. The photosensitive hardmask material may be of a negative resist type. For example, an exposed portion of the hardmask layer 220 may not be dissolved by a developing solution, and an unexposed portion thereof may be dissolved by the developing solution. The photosensitive hardmask material may contain a resin, a photoresist material, a cross-linking agent, and/or a solvent. The resin may include, for example, at least one of aromatic hydrocarbon, such as naphthalene, anthracene, and pyrene, with two or more benzene rings, aromatic hydrocarbon with a hydroxyl group and two or more benzene rings, novolak, and/or poly hydroxyl styrene but is not limited thereto. The photoresist material may include, for example, at least one of a photoacid generator (PGA), such as triphenylsulfonium, and/or a photoactive compound, but is not limited thereto. The cross-linking agent may be an amine-based and/or phenol-based material, but is not limited thereto.

Figure 20:
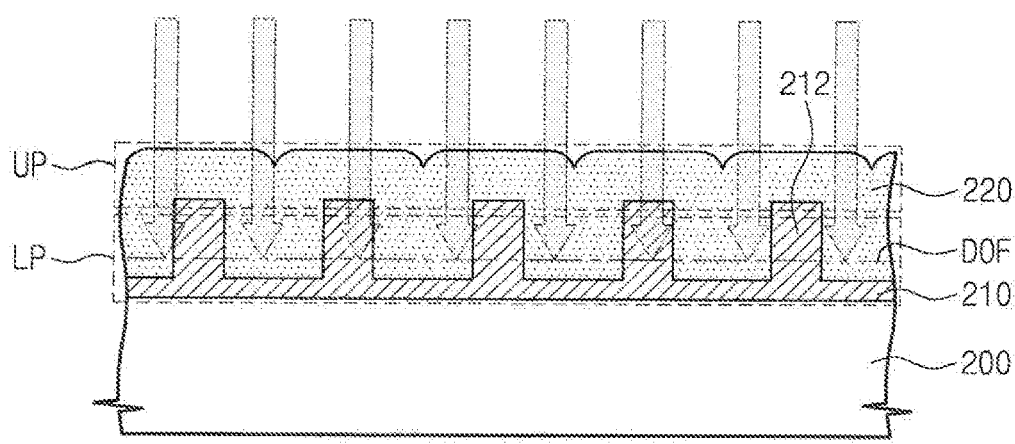
Figure 21:
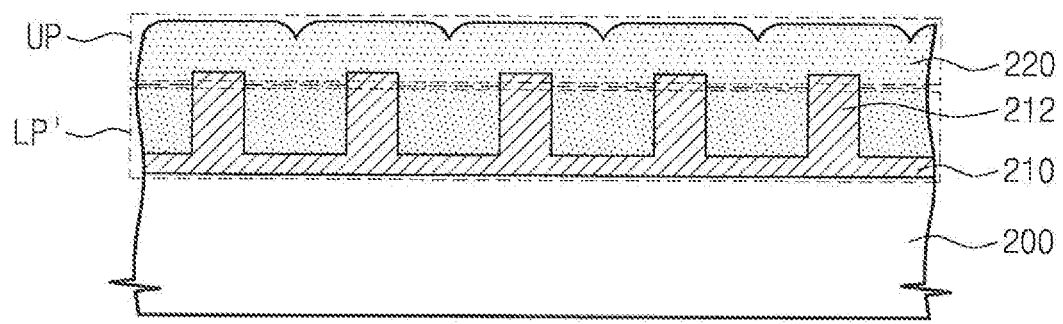

Referring to FIGS. 20 and 21, an exposing process may be performed on the resulting structure with the hardmask layer 220. In the exposing process, a depth of focus DOF may be controlled to be between the levels of top surfaces of the lower patterns 212 and a bottom surface of the hardmask layer 220. Accordingly, the exposing process may be performed on the lower portion LP of the hardmask layer 220. The exposed lower portion LP' of the hardmask layer 220 may have a decreased solubility to a developing solution.

Figure 22:
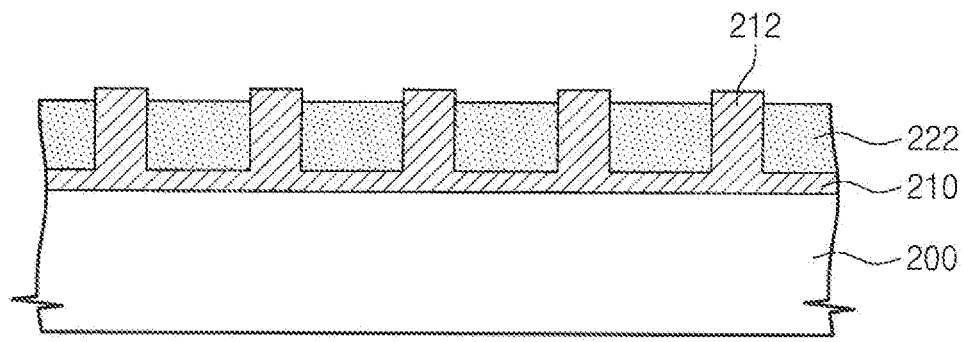

Referring to FIG. 22, a developing process may be performed to remove the upper portion UP of the hardmask layer 220. As a result of the removal of the upper portion UP, a hardmask structure 222 may be formed to have a substantially flat top surface and the top surfaces of the lower patterns 212 may be exposed. In other words, since the upper portion UP having the non-flat top surface is removed, the resulting hardmask structure 222 may have a substantially flat top surface.

Since the lower patterns 212 are exposed by the exposing and developing process, the hardmask structure 222 can be formed without using an etch-back or chemical mechanical polishing (CMP) process. Accordingly, it may be possible to simplify the overall fabrication process and/or improve productivity of the fabrication process.

FIGS. 23 through 30 are sectional views illustrating methods of fabricating semiconductor devices according to still further example embodiments of the present inventive concepts.

Figure 23:
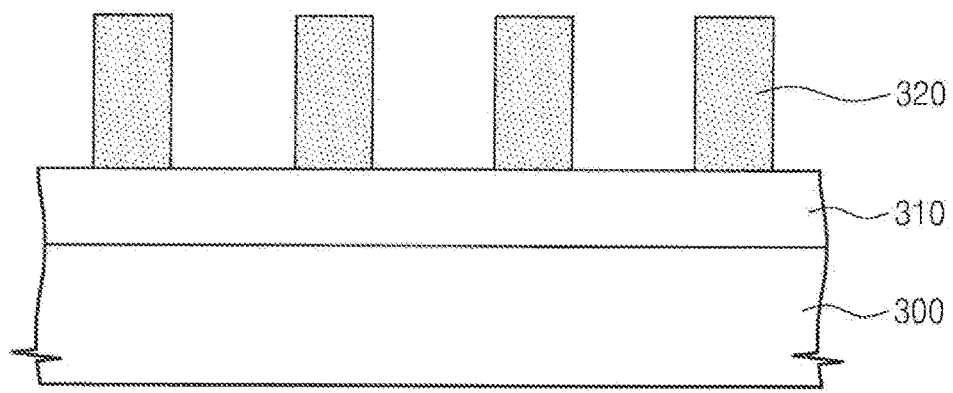
FIGS. 23 through 30 are sectional views illustrating methods of fabricating semiconductor devices according to still further example embodiments of the present inventive concepts.

Referring to FIG. 23, first hardmask patterns 320 may be formed on a lower layer 310. The lower layer 310 may be provided on a substrate 300. The formation of the first hardmask patterns 320 may include forming a first hardmask layer on the lower layer 310 and patterning the first hardmask layer.

Figure 24:
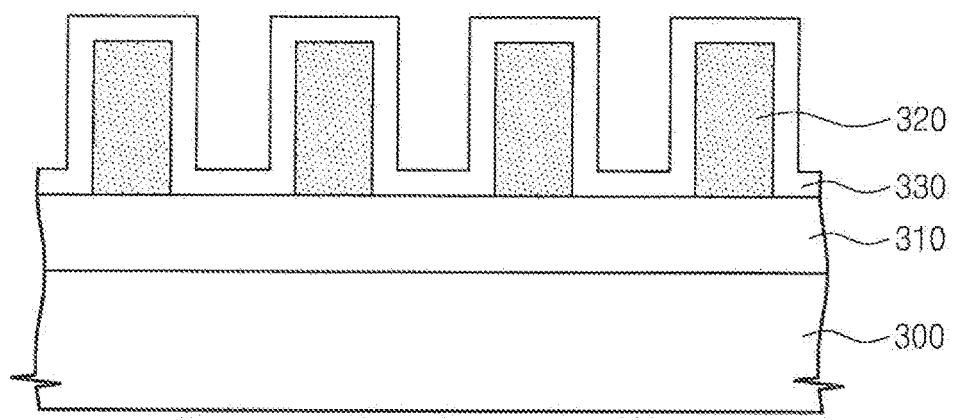

Referring to FIG. 24, a spacer layer 330 may be formed to conformally cover the first hardmask patterns 320 and portions of the lower layer 310 exposed between the first hardmask patterns 320. The spacer layer 330 may be formed using, for example, an atomic layer deposition (ALD) process.

Referring to FIGS. 25A through 27, second hardmask patterns 342 may be formed. The second hardmask patterns 342 may be formed by various methods. For example, the second hardmask patterns 342 may be formed using a method illustrated in FIGS. 25A, 25B, 25C, and 27. Other embodiments of the present inventive concepts may use another method illustrated in FIGS. 26A, 26B, 26C, and 27.

Firstly, referring to FIGS. 25A, 25B, 25C, and 27, the formation of the second hardmask patterns 342 may include forming a second hardmask layer 340 on the spacer layer 330 and then removing a portion of the second hardmask layer 340 to expose the spacer layer 330. Here, the second hardmask layer 340 may include a lower portion LP and an upper portion UP on the lower portion LP, and the removal process may be performed to remove the upper portion UP of the second hardmask layer 340. In example embodiments of the present inventive concepts, the upper portion UP of the second hardmask layer 340 may be removed using an exposing and developing process.

Figure 25A:
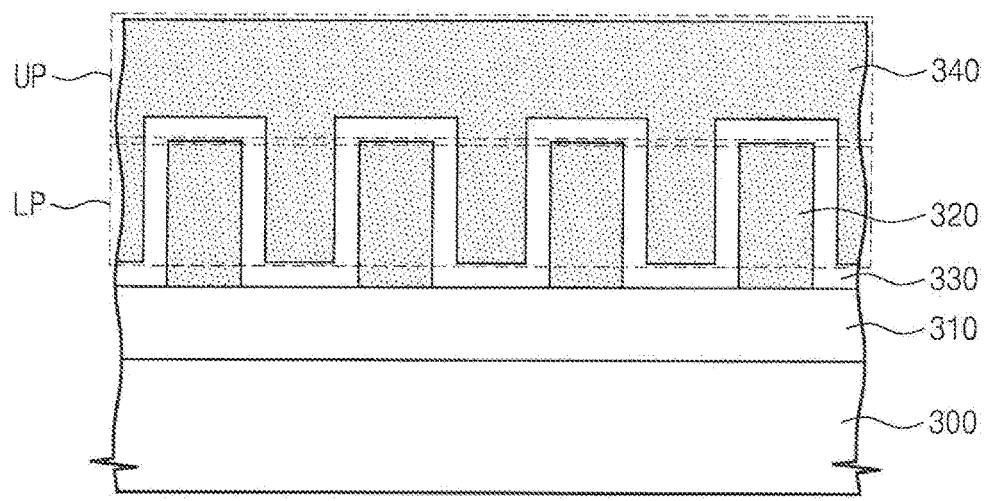

In more detail, as shown in FIG. 25A, the second hardmask layer 340 may be formed on the spacer layer 330. The second hardmask layer 340 may be formed to fill gaps between the first hardmask patterns 320. The second hardmask layer 340 may include the lower portion LP between the first hardmask patterns 320 and the upper portion UP on the first hardmask patterns 320. For example, the lower portion LP may be a portion of the second hardmask layer 340 positioned below the level of the top surfaces of the first hardmask patterns 320 and/or the uppermost top surface of the spacer layer 330.

The second hardmask layer 340 may be formed by coating the spacer layer 330 with a photosensitive hardmask material using, for example, a spin coating process. The photosensitive hardmask material may be of a positive resist type. For example, an exposed portion of the second hardmask layer 340 may be dissolved by a developing solution, and an unexposed portion thereof may not be dissolved by the developing solution. The photosensitive hardmask material may contain a resin, a photoresist material, a cross-linking agent, and/or a solvent. The resin may include, for example, at least one of aromatic hydrocarbon, such as naphthalene, anthracene, and pyrene, with two or more benzene rings, aromatic hydrocarbon with a hydroxyl group and two or more benzene rings, novolak, and/or poly hydroxyl styrene, but is not limited thereto. The photoresist material may include, for example, at least one of an organic acid, a photoacid generator (PGA), such as sulfonate and diazosulfonate, and/or a photoactive compound such as diazo naphta quinone, but is not limited thereto. The cross-linking agent may be aminoplast, but is not limited thereto.

Figure 25B:
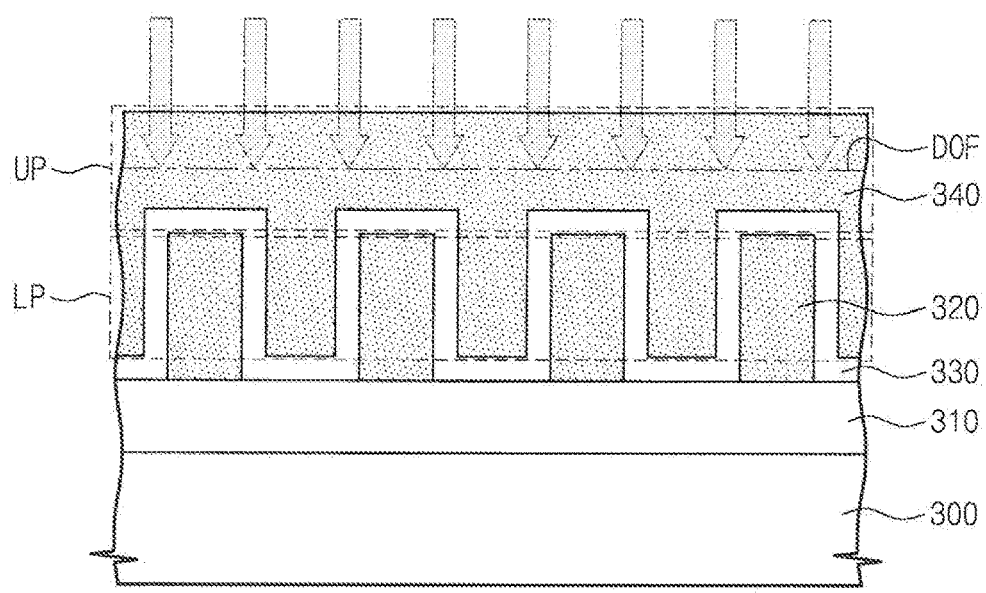
Figure 25C:
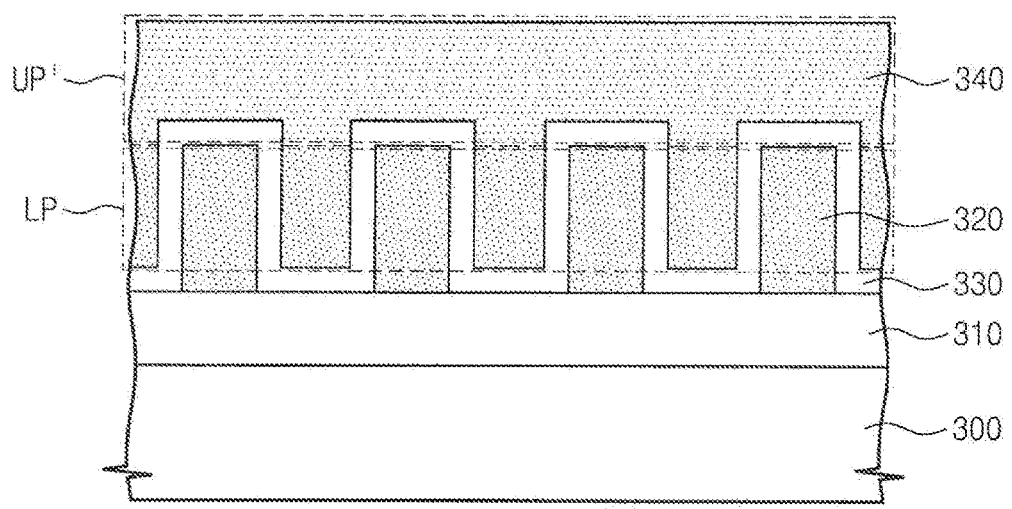

Referring to FIGS. 25B and 25C, an exposing process may be performed on the resulting structure with the first hardmask patterns 320 and the second hardmask layer 340. In the exposing process, a depth of focus DOF may be controlled to be between the levels of top surfaces of the first hardmask patterns 320 and a top surface of the second hardmask layer 340. Accordingly, the exposing process may be performed on the upper portion UP of the second hardmask layer 340. The exposed upper portion UP' of the second hardmask layer 340 may have an increased solubility to a developing solution.

Figure 27:
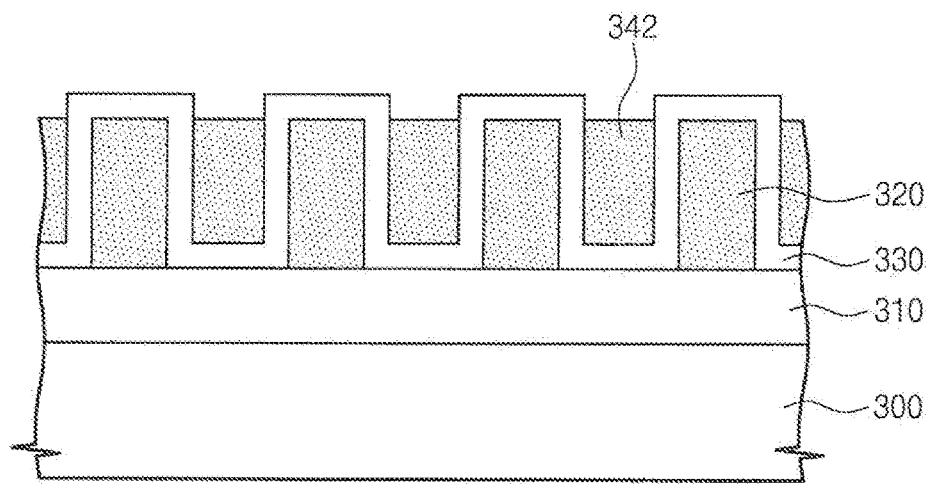

Referring to FIG. 27, a developing process may be performed to remove the exposed upper portion UP' of the second hardmask layer 340. Accordingly, the second hardmask patterns 342 may be formed between the first hardmask patterns 320. For example, the second hardmask patterns 342 may be formed to expose portions of the spacer layer 330 positioned on the first hardmask patterns 320. The second hardmask patterns 342 may be the lower portion LP of the second hardmask layer 340.

Next, referring to FIGS. 26A, 26B, 26C, and 27, the formation of the second hardmask patterns 342 may include forming a second hardmask layer 340 on the spacer layer 330 and then removing a portion of the second hardmask layer 340 to expose the spacer layer 330. Here, the second hardmask layer 340 may include a lower portion LP and an upper portion UP on the lower portion LP, and the removal process may be performed to remove the upper portion UP of the second hardmask layer 340. In example embodiments, the upper portion UP of the second hardmask layer 340 may be removed using an exposing and developing process.

Figure 26A:
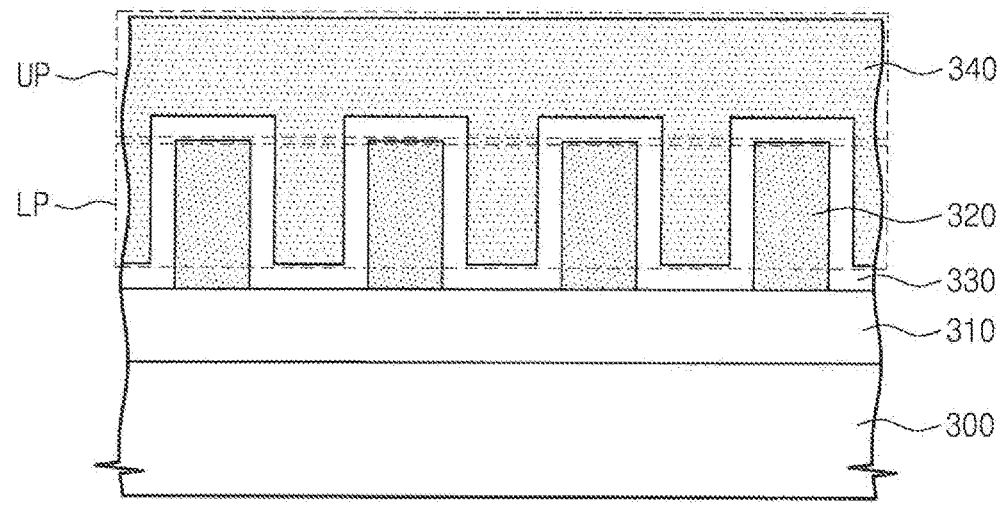

In more detail, as shown in FIG. 26A, the second hardmask layer 340 may be formed on the spacer layer 330. The second hardmask layer 340 may be formed to fill gaps between the first hardmask patterns 320. The second hardmask layer 340 may include the lower portion LP between the first hardmask patterns 320 and the upper portion UP on the first hardmask patterns 320. For example, the lower portion LP may be a portion of the second hardmask layer 340 positioned below the level of the top surfaces of the first hardmask patterns 320 and/or the uppermost top surface of the spacer layer 330.

The second hardmask layer 340 may be formed by coating the spacer layer 330 with a photosensitive hardmask material using, for example, a spin coating process. The photosensitive hardmask material may be of a negative resist type. For example, an exposed portion of the second hardmask layer 340 may not be dissolved by a developing solution, and an unexposed portion thereof may be dissolved by the developing solution. The photosensitive hardmask material may contain a resin, a photoresist material, a cross-linking agent, and/or a solvent. The resin may include, for example, at least one of aromatic hydrocarbon, such as naphthalene, anthracene, and pyrene, with two or more benzene rings, aromatic hydrocarbon with a hydroxyl group and two or more benzene rings, novolak, and/or poly hydroxyl styrene, but is not limited thereto. The photoresist material may include, for example, at least one of a photoacid generator (PGA), such as triphenylsulfonium, and/or a photoactive compound, but is not limited thereto. The cross-linking agent may be an amine-based and/or phenol-based material, but is not limited thereto.

Figure 26B:
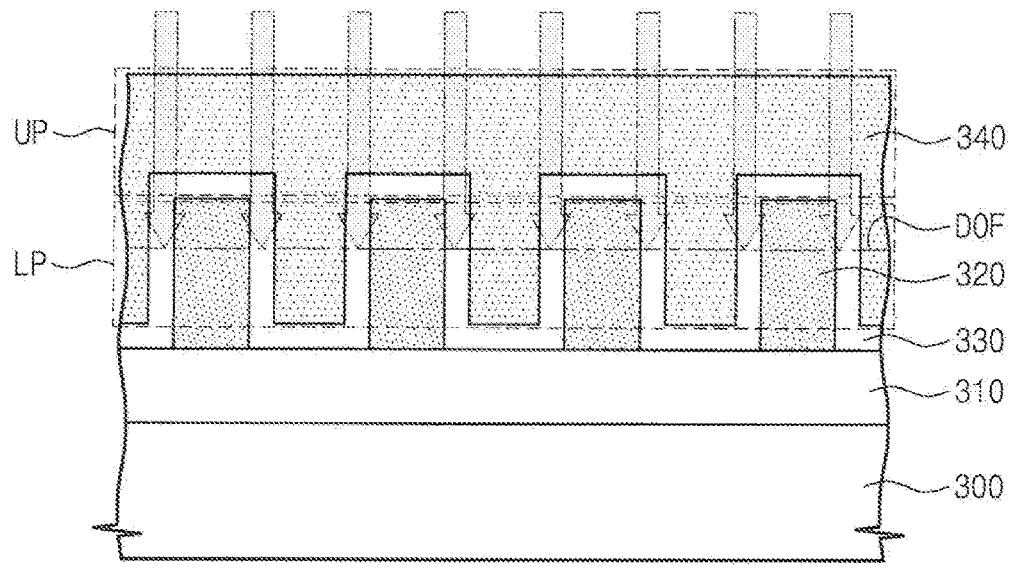
Figure 26C:
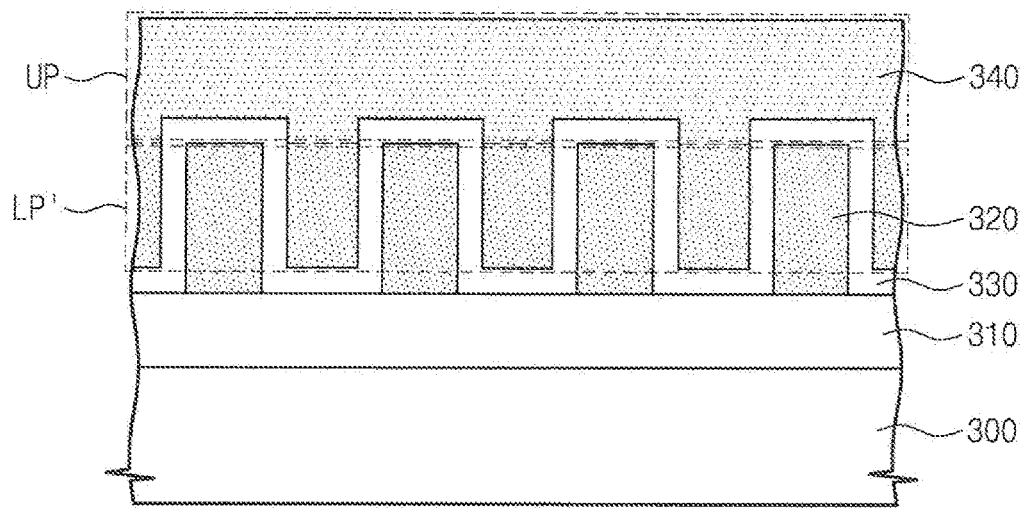

Referring to FIGS. 26B and 26C, an exposing process may be performed on the resulting structure with the first hardmask patterns 320 and the second hardmask layer 340. In the exposing process, a depth of focus DOF may be controlled to be between the levels of top surfaces of the first hardmask patterns 320 and the lower layer 310. Accordingly, the exposing process may be performed on the lower portion LP of the second hardmask layer 340. The exposed lower portion LP' of the second hardmask layer 340 may have a decreased solubility to a developing solution.

Referring to FIG. 27, a developing process may be performed to remove the upper portion UP of the second hardmask layer 340. Accordingly, the second hardmask patterns 342 may be formed between the first hardmask patterns 320. For example, the second hardmask patterns 342 may be formed to expose portions of the spacer layer 330 positioned on the first hardmask patterns 320. The second hardmask patterns 342 may be the exposed lower portion LP' of the second hardmask layer 340.

As described above, the second hardmask patterns 342 can be formed by the exposing and developing process. That is, the second hardmask patterns 342 can be formed without using an etch-back or chemical mechanical polishing (CMP) process. Accordingly, it may be possible to simplify the overall fabrication process and improve productivity of the fabrication process.

As a scaling-down of patterns is accelerated, a void may be formed in the second hardmask layer 340. If an etch-back or CMP process is performed on a structure having the void, the spacer layer 330 and/or the first hardmask pattern 320 may be attacked or damaged. However, according to example embodiments of the present inventive concepts, the exposing and developing process may be used to flatten the second hardmask layer 340 instead of an etch-back or CMP process, and thus, such a problem can be reduced or prevented.

Figure 28:
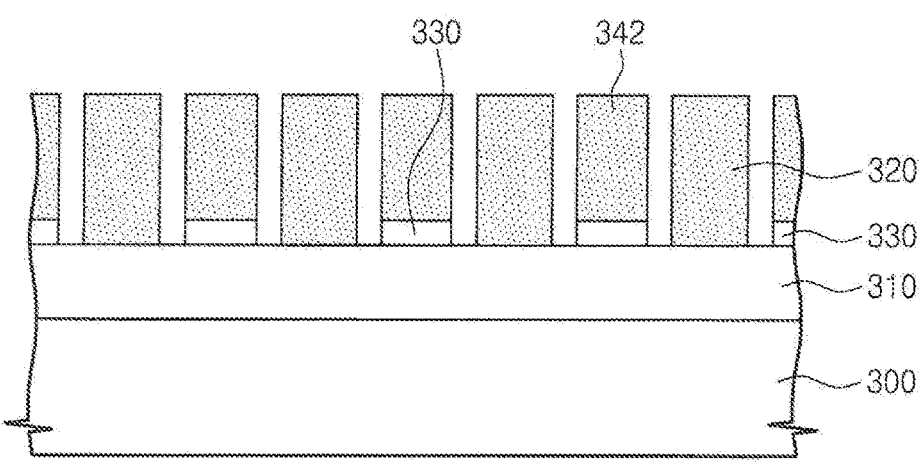

Referring to FIG. 28, the spacer layer 330 may be partially removed from gap regions between the first and second hardmask patterns 320 and 342. The partial removal of the spacer layer 330 may be performed using, for example, an etch recipe having a high etch selectivity with respect to the first and second hardmask patterns 320 and 342. As a result of the partial removal of the spacer layer 330, a top surface of the lower layer 310 may be partially exposed between the first and second hardmask patterns 320 and 342.

Figure 29:
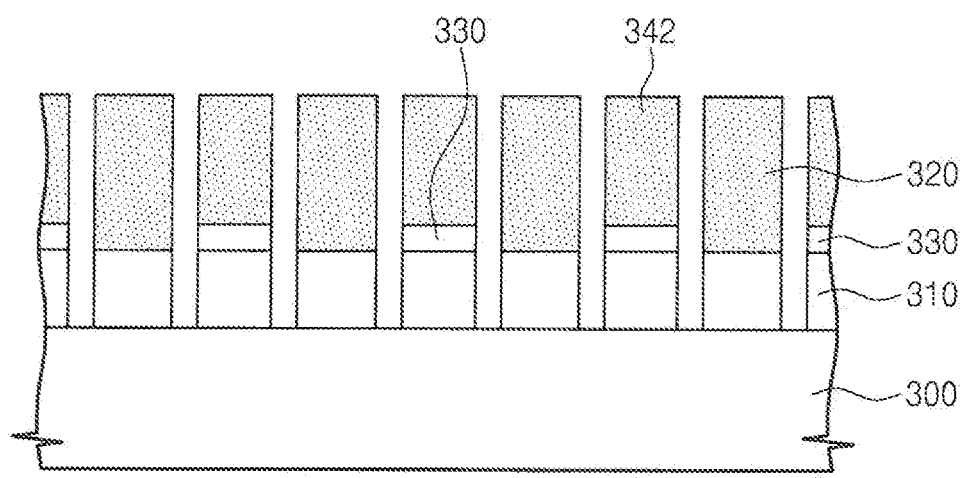
Figure 30:
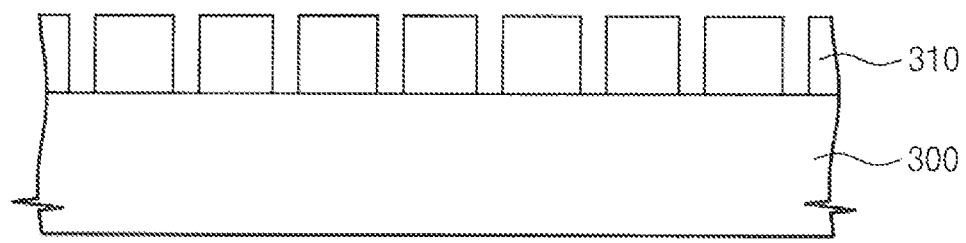

Referring to FIGS. 29 and 30, the lower layer 310 may be patterned using the first and second hardmask patterns 320 and 342 as an etch mask. The patterning of the lower layer 310 may be performed using, for example, a plasma etching process. The first and second hardmask patterns 320 and 342 and the remaining portions of the spacer layer 330 may be removed after the patterning of the lower layer 310.

According to example embodiments of the present inventive concepts, an exposing and developing process can be used to flatten a hardmask layer, and thus, it may be possible to simplify a process of fabricating semiconductor devices and/or improve productivity of the fabrication process.

While example embodiments of the present inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
forming a hardmask layer comprising a photosensitive hardmask material on a structure, the hardmask layer having a top surface comprising a first top surface on a lower portion of the hardmask layer and a second top surface, on an upper portion of the hardmask layer, wherein the first top surface is located at a first level and the second top surface is located at a second level higher than the first level; and performing an exposing and developing process on the hardmask layer that removes the upper portion of the hardmask layer while leaving the lower portion of the hardmask layer intact and forms a hardmask structure with a substantially flat top surface, wherein the flat top surface is located at a third level equal to or lower than the first level, and wherein the third level is higher than an upper surface of the structure.

2. The method of claim 1, wherein the photosensitive hardmask material comprises a resin, a photoresist material, and/or a cross-linking agent.

3. The method of claim 2, wherein the resin comprises aromatic hydrocarbon with two or more benzene rings, aromatic hydrocarbon with a hydroxyl group and two or more benzene rings, novolak, and/or poly hydroxyl styrene.

4. The method of claim 2, wherein the photoresist material comprises a photoacid generator and/or a photoactive compound.

5. The method of claim 1, wherein the upper portion of the hardmask layer is between the first level of the first top surface and the second level of the second top surface of the hardmask layer in a vertical direction, and
wherein the lower portion of the hardmask layer is positioned below the first top surface of the hardmask layer in a vertical direction.

6. The method of claim 5, wherein the hardmask layer comprises a photosensitive material of a positive resist type, and
the exposing and developing process is performed so that a depth of focus during exposure of the hardmask layer is positioned between the first and second top surfaces in a vertical direction, thereby exposing the upper portion of the hardmask layer.

7. The method of claim 5, wherein the hardmask layer comprises a photosensitive material of a positive resist type, and
the exposing and developing process uses a reticle to block exposure of the lower portion of the hardmask layer.

8. The method of claim 5, wherein the hardmask layer comprises a photosensitive material of a negative resist type, and
the exposing and developing process is performed so that a depth of focus is positioned between the first top surface of the hardmask layer and a bottom surface of the hardmask layer in a vertical direction, thereby exposing the lower portion of the hardmask layer.

9. The method of claim 5, wherein the hardmask layer comprises a photosensitive material of a negative resist type,
the exposing and developing process is configured to locally expose a portion of the lower portion of the hardmask layer below the first top surface of the hardmask layer, using a reticle configured to expose the first top surface of the hardmask layer.

10. The method of claim 1, wherein the structure comprises lower patterns, and
the removal of the upper portion of the hardmask layer exposes top surfaces of the lower patterns.

11. The method of claim 9, wherein the exposing and developing process is further configured to control a process time of the developing process to selectively remove a portion of the hardmask layer below the second top surface.

12. A method of fabricating a semiconductor device, comprising:
forming a structure on a substrate;
forming a hardmask layer comprising a photosensitive hardmask material on the structure, the hardmask layer having a top surface comprising a first top surface on a lower portion of the hardmask layer and a second top surface on an upper portion of the hardmask layer,
wherein the first top surface is located at a first level and the second top surface is located at a second level higher than the first level,
wherein the upper portion of the hardmask layer is between the first level and the second level in a vertical direction, and
wherein the lower portion of the hardmask layer is below the first top surface of the hardmask layer in a vertical direction;
performing an exposing process on the hardmask layer wherein a depth of focus of a light source is configured to selectively expose a portion of the hardmask layer; and
performing a developing process on the hardmask layer that removes the upper portion of the hardmask layer and forms a hardmask structure with a substantially flat top surface,
wherein the flat top surface is located at a third level equal to or lower than the first level, and
wherein the third level is higher than an upper surface of the structure.

13. The method of claim 12, wherein the hardmask layer comprises a photosensitive material of a positive resist type,
wherein the depth of focus of the light source is configured to be between the first and second top surfaces, and
wherein performing the exposing process exposes the upper portion of the hardmask layer and increases the solubility of the upper portion to a developing solution.

14. The method of claim 13, further comprising a reticle configured to expose the second top surface but not expose the first top surface, and
wherein performing the developing process on the hardmask layer removes the upper portion of the hardmask layer but leaves a substantial portion of the lower portion of the hardmask layer remaining.

15. The method of claim 12, wherein the hardmask layer comprises a photosensitive material of a negative resist type,
wherein the depth of focus of the light source is configured to be below or even with the first top surface, and
wherein performing the exposing process exposes the lower portion of the hardmask layer and decreases the solubility of a portion of the lower portion of the hardmask layer to a developing solution.

16. The method of claim 15, further comprising a reticle configured to expose the first top surface but not expose the second top surface, and
wherein performing the developing process on the hardmask layer comprises performing the developing process for a duration of time configured to remove the upper portion of the hardmask layer but leave a substantial portion of the lower portion of the hardmask layer remaining.

17. The method of claim 1, wherein the lower portion of the hardmask layer is on a first region of the structure,
wherein the upper portion of the hardmask layer is on a second region of the structure, and
wherein the substantially flat top surface is on the first region and the second region of the structure.

18. The method of claim 17, wherein the lower portion of the hardmask layer is on the first region and the second region of the structure.

19. The method of claim 12, wherein the lower portion of the hardmask layer is on a first region of the substrate,
wherein the upper portion of the hardmask layer is on a second region of the substrate, and
wherein the substantially flat top surface is on the first region and the second region of the substrate.

20. The method of claim 19, wherein the lower portion of the hardmask layer is on the first region and the second region of the substrate.

\* \* \* \* \*